United States Patent
Zhang

(10) Patent No.: US 9,205,515 B2
(45) Date of Patent: Dec. 8, 2015

(54) HEAT DISSIPATION SUBSTRATE AND METHOD FOR MANUFACTURING THE SAME

(75) Inventor: Tian Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 606 days.

(21) Appl. No.: 13/519,261

(22) PCT Filed: Apr. 18, 2012

(86) PCT No.: PCT/CN2012/074258
§ 371 (c)(1),
(2), (4) Date: Jun. 26, 2012

(87) PCT Pub. No.: WO2013/139058
PCT Pub. Date: Sep. 26, 2013

(65) Prior Publication Data
US 2013/0248143 A1 Sep. 26, 2013

(30) Foreign Application Priority Data
Mar. 22, 2012 (CN) .......................... 2012 1 0076940

(51) Int. Cl.
*F28F 3/02* (2006.01)
*B23P 15/26* (2006.01)
*F28F 21/04* (2006.01)
(Continued)

(52) U.S. Cl.
CPC ................. *B23P 15/26* (2013.01); *F28F 21/04* (2013.01); *B22F 3/11* (2013.01); *F28F 3/02* (2013.01); *F28F 3/04* (2013.01); *F28F 2013/001* (2013.01); *H01L 21/4871* (2013.01); *H01L 23/3731* (2013.01); *H01L 23/3733* (2013.01); *H01L 2924/0002* (2013.01)

(58) Field of Classification Search
CPC ......... B05D 3/024; B22F 3/10; B22F 3/1039; B22F 3/11; B23P 15/26; B23P 2700/09; B23P 2700/10; H01L 21/4871; H01L 23/3731; H01L 23/3733; Y10T 29/4935; Y10T 29/49353
See application file for complete search history.

(56) References Cited

U.S. PATENT DOCUMENTS 3,356,130 A * 12/1967 Mellen, Jr. et al. ........... 425/144
4,531,145 A * 7/1985 Wiech, Jr. ..................... 257/714
(Continued)

FOREIGN PATENT DOCUMENTS

| CN | 2478249 Y | 2/2002 |
|----|-----------|--------|
| CN | 1667822 A | 9/2005 |

(Continued)

*Primary Examiner* — Alexander P Taousakis
(74) *Attorney, Agent, or Firm* — Muncy, Geissler, Olds & Lowe, P.C.

(57) ABSTRACT

A heat dissipation substrate comprises a substrate material and a heat conductive liquid. The substrate material comprises a plurality of holes and the heat conductive liquid is permeated into the holes. The thermal expansion coefficient of the heat conductive liquid is larger than that of the substrate material. A heat dissipation substrate manufacturing method comprises steps of mixing a sinter powder and an adhesive to form a substrate material; placing the substrate material into a furnace to perform a sintering process in order to form a plurality of holes in the substrate material; and permeating a heat conductive liquid into the holes.

5 Claims, 4 Drawing Sheets

(51) Int. Cl.
*F28F 3/04* (2006.01)
*B22F 3/11* (2006.01)
*H01L 23/373* (2006.01)
*H01L 21/48* (2006.01)
*F28F 13/00* (2006.01)

(56) References Cited

U.S. PATENT DOCUMENTS

| | | | |
|---|---|---|---|
| 2002/0086253 A1* | 7/2002 | Young et al. | 431/11 |
| 2003/0133856 A1* | 7/2003 | Le | 422/198 |
| 2004/0069455 A1* | 4/2004 | Lindemuth et al. | 165/104.15 |
| 2004/0159422 A1* | 8/2004 | Zuo et al. | 165/104.14 |
| 2007/0241482 A1* | 10/2007 | Giller et al. | 264/494 |
| 2008/0131665 A1* | 6/2008 | Suyama et al. | 428/149 |
| 2011/0003141 A1* | 1/2011 | Garbar | 428/328 |
| 2011/0083835 A1* | 4/2011 | Chen et al. | 165/185 |
| 2011/0248205 A1* | 10/2011 | Taguchi et al. | 252/62 |
| 2012/0152507 A1* | 6/2012 | Godry | 165/173 |
| 2015/0004041 A1* | 1/2015 | Tanaka et al. | 419/2 |

FOREIGN PATENT DOCUMENTS

| | | |
|---|---|---|
| CN | 100375300 C | 3/2008 |
| CN | 100508708 C | 7/2009 |
| CN | 101927426 A | 12/2010 |
| CN | 102143649 A | 8/2011 |
| JP | 2011187598 | 9/2011 |

* cited by examiner

HEAT DISSIPATION SUBSTRATE AND METHOD FOR MANUFACTURING THE SAME

FIELD OF THE INVENTION

The present invention relates to a heat dissipation material and more particularly to a heat dissipation substrate with a heat conductive liquid permeated into a substrate material and method for manufacturing the same.

BACKGROUND OF THE INVENTION

As the electronic industry develops flourishingly, various electronic devices for different applications are introduced into the market. However, the electronic components inside an electronic device will generate heat as time increases gradually. Therefore, it is important in the industry to deal with the heat dissipation problem of electronic devices.

Referring to FIG. 1 is a structural illustration of a conventional heat dissipation plate. As shown in FIG. 1, a heat dissipation plate 30 is commonly used as a heat dissipation device in an electronic product. The heat dissipation plate 30 comprises a plurality of fins 301 disposed at intervals. The heat dissipation problem of a common electronic device can be improved by employing the heat dissipation plate 30. In order to reduce the thermal resistance between the heat dissipation plate 30 and the heat source, it is either to enhance the degree of finish of the contact surface between the heat dissipation plate 30 and the heat source, or a thermal conductive grease or adhesive is placed on the contact interface. The above-mentioned method will increase the cost of the heat dissipation solution.

SUMMARY

The present invention provides a heat dissipation substrate with a heat conductive liquid permeated into a substrate material and method for manufacturing the same.

According to the above objective, the present invention provides a heat dissipation substrate comprising a substrate material and a heat conductive liquid. The substrate material comprises a plurality of holes and the heat conductive liquid is permeated into the holes. The thermal expansion coefficient of the heat conductive liquid is larger than that of the substrate material.

The heat dissipation substrate further comprises:

the substrate material being formed by pressing and sintering a sinter powder;

a heat dissipation plate further disposed on a surface of the substrate material;

a light source further disposed on the surface of the substrate material to be used as a backlight source of a backlight module, the substrate material being disposed at a place in contact with a light source circuit board of the backlight source; and the heat conductive liquid being a thermal conductive grease.

A manufacturing method of a heat dissipation substrate is also provided by the present invention. The manufacturing method comprises steps of mixing a sinter powder and an adhesive to form a substrate material; placing the substrate material into a furnace to perform a sintering process in order to form a plurality of holes in the substrate material; and permeating a heat conductive liquid into the holes.

The manufacturing method of the heat dissipation substrate further comprises:

the sinter powder including aluminum, copper or tungsten, the adhesive including a solvent of calcium oxide-aluminum oxide-silicon dioxide ($CaO$—$Al_2O_3$—$SiO_2$), a solvent of magnesium-aluminum oxide-silicon dioxide ($Mg$—$Al_2O_3$—$SiO_2$) or a solvent of manganese monoxide-magnesium monoxide-aluminum oxide-silicon dioxide ($MnO$—$MgO$—$Al_2O_3$—$SiO_2$);

the heat conductive liquid being a thermal conductive grease;

the heat conductive liquid further permeating into the holes by vacuum effect or capillarity;

a coating further disposed on a non-heat dissipation surface of the substrate material; and an imperforate layer further covered on a non-heat dissipation surface of the substrate material.

The present invention has an advantageous effect in that: when the heat dissipation plate is heated up and because the thermal expansion coefficient of the substrate material with the holes is different from that of the heat conductive liquid, the heat conductive liquid will be separated out of the substrate material with the holes and the separated heat conductive liquid will fill the air gaps in the contact interface by capillarity. Thus the thermal resistance from the heat source to the surface under the contact interface can be reduced substantially.

DETAILED DESCRIPTION OF THE INVENTION

The preferred embodiment of the present invention will be described in detail with reference to accompanying drawings.

Figure 1:
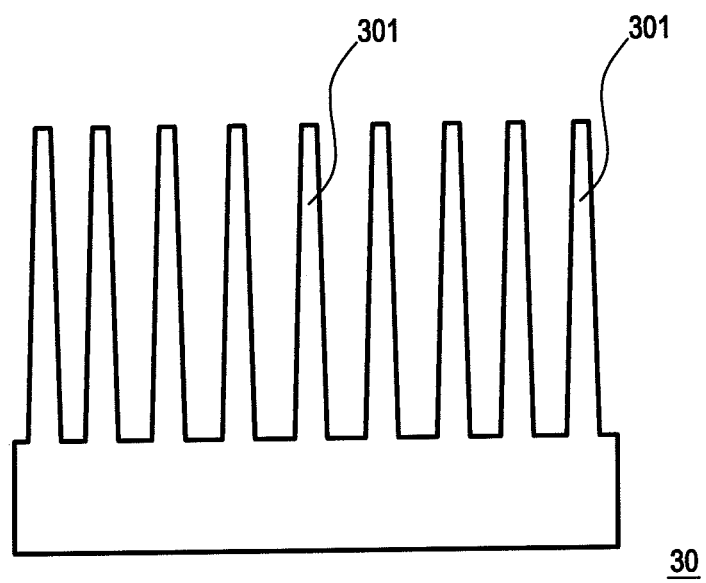
FIG. 1 is a structural illustration of a conventional heat dissipation plate.
Figure 2:
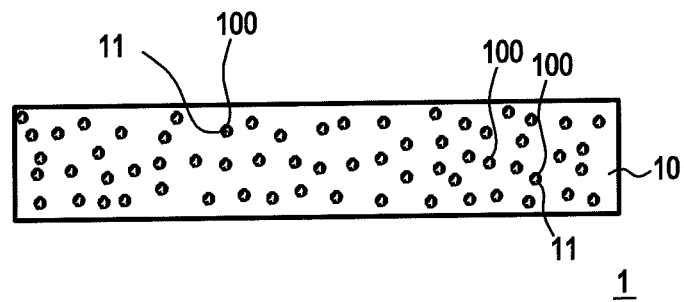
FIG. 2 is an illustration of a heat dissipation substrate according to an embodiment of the present invention.

Referring to FIG. 2 is an illustration of a heat dissipation substrate according to an embodiment of the present invention.

As shown in FIG. 2, a heat dissipation substrate 1 comprises a substrate material 10 and a heat conductive liquid 11. The substrate material 10 comprises a plurality of holes 100 and the heat conductive liquid 11 is permeated into the holes 100. The thermal expansion coefficient of the heat conductive liquid 11 is larger than that of the substrate material 10.

Wherein, the substrate material 10 is formed by pressing and sintering a sinter powder, the heat conductive liquid 11 is a thermal conductive grease, but is not limited thereto.

Figure 3:
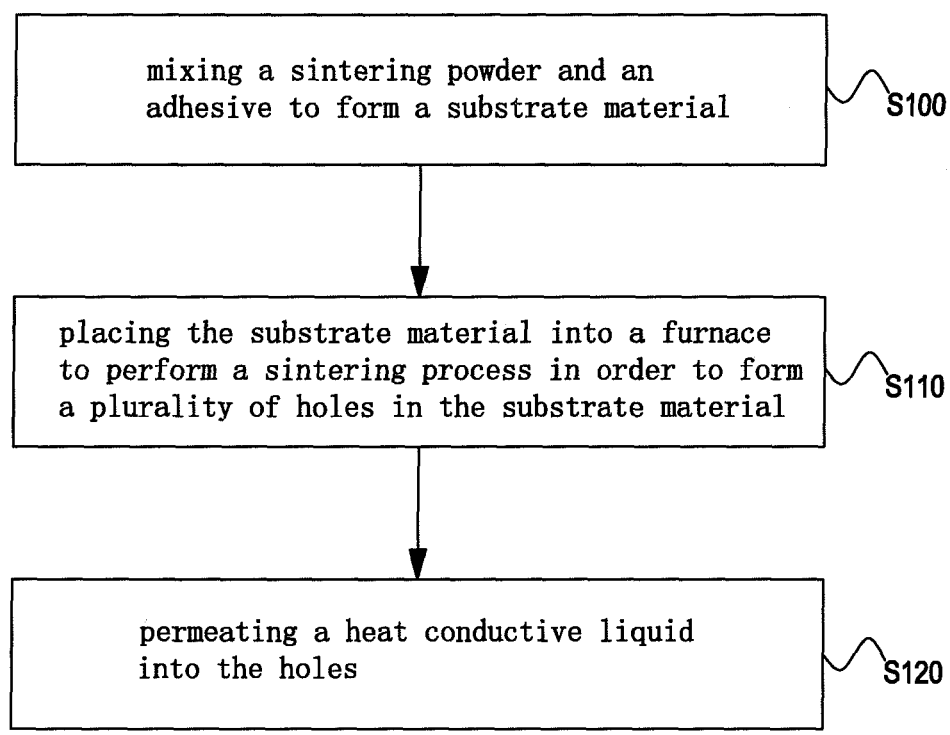
FIG. 3 is a flow chart of a manufacturing method of the heat dissipation substrate in FIG. 2.

Please refer to FIGS. 2 and 3. FIG. 3 is a flow chart of a manufacturing method of the heat dissipation substrate in FIG. 2.

The manufacturing method of the heat dissipation substrate comprises following steps of:

mixing a sintering powder and an adhesive to form a substrate material (step S100); placing the substrate material into a furnace to perform a sintering process in order to form a plurality of holes in the substrate material (step S110); and permeating a heat conductive liquid into the holes (step S120).

Wherein, in the step of mixing the sintering powder and the adhesive to form the substrate material (step S100), the sintering powder includes aluminum, copper or tungsten;

the adhesive includes a solvent of calcium oxide-aluminum oxide-silicon dioxide ($CaO$—$Al_2O_3$—$SiO_2$), a solvent of magnesium-aluminum oxide-silicon dioxide ($Mg$—$Al_2O_3$—$SiO_2$) or a solvent of manganese monoxide-magnesium oxide-aluminum oxide-silicon dioxide ($MnO$—$MgO$—$Al_2O_3$—$SiO_2$). It will be seen from this that the substrate material 10 of the heat dissipation substrate 1 in FIG. 2 can be manufactured by mixing the sinter powder and the adhesive. More specifically, the preliminary shape of the substrate material 10 can be prepared by a pressing mould, an injection molding, an extruding or a rolling.

Then, in the step of placing the substrate material into the furnace to perform sintering in order to form the plurality of holes in the substrate material (step S110), the substrate material 10 can be made into a porous material with a certain degree of strength and rigidity (e.g. the substrate material 10 has the holes 100 and the substrate material 10 itself has a certain degree of strength and rigidity) by placing the substrate material 10 into the furnace to perform sintering.

Then, in the step of permeating the heat conductive liquid into the holes (step S120), the heat conductive liquid 11 is further permeated into the holes 100 by vacuum effect or capillarity (or permeated into a solidus-liquidus phase transition thermal conductive material by vacuum effect or capillarity under a certain temperature). Thereby, the heat dissipation substrate 1 is manufactured. The heat conductive liquid 11 is a thermal conductive grease, but it is not limited thereto.

Furthermore, in the step S110 of placing the substrate material 10 into the furnace to perform sintering, and after the substrate material 10 is made into a porous material with a certain degree of strength and rigidity (e.g. the substrate material 10 has the holes 100 and the substrate material 10 itself has a certain degree of strength and rigidity), procedures of processing and shaping can be performed.

Figure 4:
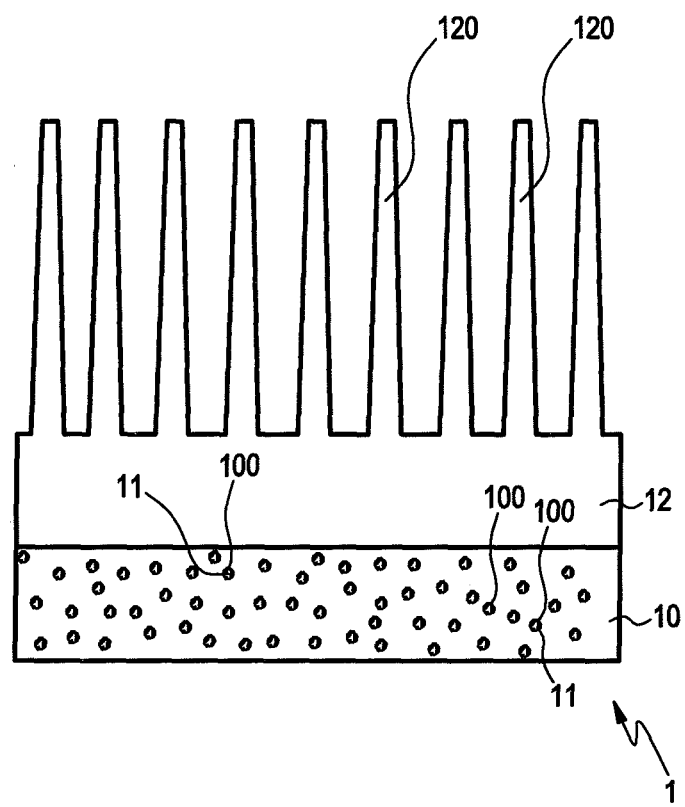
FIG. 4 is an illustration of a heat dissipation plate disposed on a surface of the heat dissipation substrate according to an embodiment of the present invention.

Please refer to FIG. 4, which is an illustration of a heat dissipation plate disposed on a surface of the heat dissipation substrate according to an embodiment of the present invention.

As shown in FIG. 4, a heat dissipation plate 12 is further disposed on a surface of the substrate material 10. The heat dissipation plate 12 comprises a plurality of fins 120 disposed in intervals. By employing this structure, a surface of the substrate material 10 with the holes 100 can be contacted with a heat source (e.g. a light emitting diode module or other electronic component which generates heat after an electronic device is electrically conducted), and another opposite surface of the substrate material 10 can be connected with the heat dissipation plate 12 in order to be used as a heat dissipation terminal.

Therefore, after the substrate material 10 of the heat dissipation substrate 1 receives heat energy from the heat source, because the thermal expansion coefficient of the substrate material 10 with the holes 100 is different from that of the heat conductive liquid 11 (e.g. a thermal conductive grease), the heat conductive liquid 11 will be separated out of the holes 100 and the heat conductive liquid 11 separated out will fill the air gaps in the contact interface in contact with the heat source by capillarity. Thus the thermal resistance from the heat source to the surface under the contact interface can be reduced substantially and the heat dissipation substrate 1 can dissipate the heat energy speedily.

Figure 5:
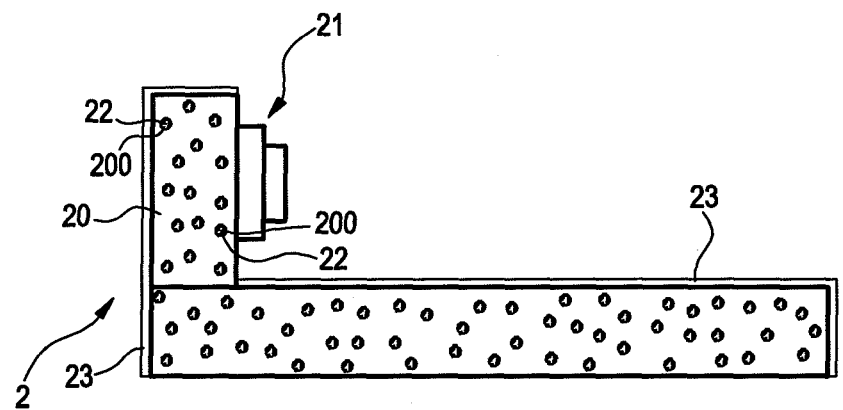
FIG. 5 is an illustration of the heat dissipation substrate being used as a thermal conductive element according to another embodiment of the present invention.

Please refer to FIG. 5, which is an illustration of the heat dissipation substrate being used as a thermal conductive element according to another embodiment of the present invention.

As shown in FIG. 5, a heat dissipation substrate 2 (comprises a substrate material 20 with a plurality of holes 200) can be used as a thermal conductive element directly. For example, a light source 21 (e.g. a LED bar) is further disposed on a surface of the substrate material 20, and the light source 21 is regarded as a heat source after it is electrically conducted and emits light. The light source 21 can be a backlight source of a backlight module of a liquid crystal display device, and the substrate material 20 is disposed at a place in contact with a light source circuit board of the backlight source (e.g. the light source 21). However, the way of the light source 21 being embodied is not limited by it.

When the light source 21 generates heat, the heat dissipation substrate 2 can be used as a thermal conductive element directly. More specifically, after the substrate material 20 of the heat dissipation substrate 2 receives heat energy from the heat source, because the thermal expansion coefficient of the substrate material 20 with the holes 200 is different from that of a heat conductive liquid 22 (e.g. a thermal conductive grease), the heat conductive liquid 22 will be separated out of the holes 200 and the heat conductive liquid 22 separated out will fill the air gaps in the contact interface in contact with the heat source by capillarity. Thus the thermal resistance from the heat source to the surface under the contact interface can be reduced substantially and the heat dissipation substrate 2 can dissipate the heat energy speedily. Furthermore, a coating 23 (e.g. paint, adhesive or teflon) can be coated on the surface (e.g. non heat dissipation surface) of the substrate material 20 of the heat dissipation substrate 2 which is not in contact with the heat source and the heat dissipation terminal (e.g. the heat dissipation plate) in order to seal off some of the holes 200.

Figure 6:
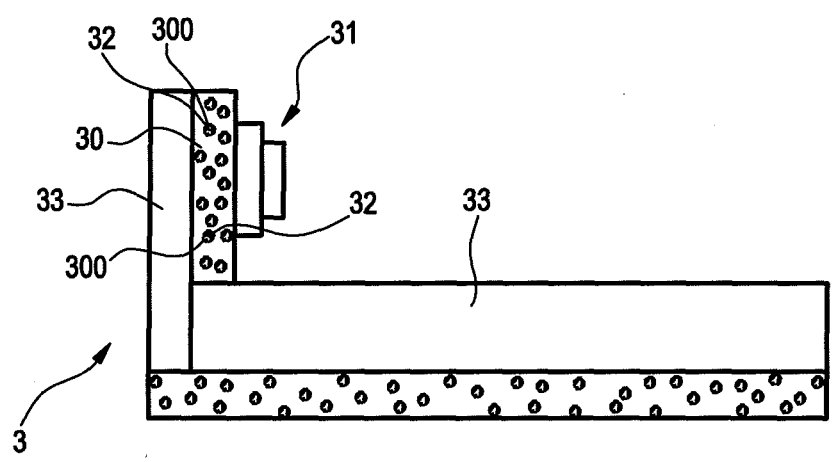
FIG. 6 is an illustration of the heat dissipation substrate being used as a thermal conductive element and a part of the heat dissipation substrate not in contact with a heat source and a heat dissipation terminal can be replaced by another material.

Please refer to FIG. 6, which is an illustration of the heat dissipation substrate being used as a thermal conductive element and a part of the heat dissipation substrate not in contact with the heat source and the heat dissipation terminal can be replaced by another material.

As shown in FIG. 6, a heat dissipation substrate 3 (comprises a substrate material 30 with a plurality of holes 300) can be used as a thermal conductive element directly. For example, a light source 31 (e.g. a LED bar) is further disposed on a surface of the substrate material 30 and the light source 31 is regarded as a heat source. The light source 31 can be a backlight source of a backlight module of a liquid crystal display device, and the substrate material 30 is disposed at a place in contact with a light source circuit board of the backlight source (e.g. the light source 31). However, the way of the light source 31 being embodied is not limited by it.

When the light source 31 generates heat, the heat dissipation substrate 3 can be used as a thermal conductive element directly. More specifically, after the substrate material 30 of the heat dissipation substrate 3 receives heat energy from the heat source, because the thermal expansion coefficient of the substrate material 30 with the holes 300 is different from that of a heat conductive liquid 32 (e.g. a thermal conductive grease), the heat conductive liquid 32 will be separated out of the holes 300 and the heat conductive liquid 32 separated out will fill the air gaps in the contact interface in contact with the heat source by capillarity. Thus the thermal resistance from the heat source to the surface under the contact interface can be reduced substantially and the heat dissipation substrate 3 can dissipate the heat energy speedily. Furthermore, another imperforate material 33 can be used to replace a part (e.g. non heat dissipation surface) of the substrate material 30 of the heat dissipation substrate 3 which is not in contact with the heat source and the heat dissipation terminal (e.g. the heat dissipation plate). The heat dissipation effect can still be achieved. By the replacement of the imperforate material, the cost for manufacturing the heat dissipation substrate 3 can be reduced and the structural strength of the heat dissipation substrate 3 can be enhanced.

Based on the above, the heat dissipation substrate and its manufacturing method disclosed in the embodiments of the present invention have the following effects:

1. When the heat dissipation plate is heated up and because the thermal expansion coefficient of the substrate material with the holes is different from that of the heat conductive liquid, the heat conductive liquid will be separated out of the substrate material with the holes and the heat conductive liquid separated out will fill the air gaps in the contact interface by, capillarity. Thus the thermal resistance from the heat source to the surface under the contact interface can be reduced substantially.

2. The heat dissipation substrate (comprises the substrate material with the holes) can be used as a thermal conductive element directly.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A manufacturing method of a heat dissipation substrate comprising steps of:
    mixing a sinter powder and an adhesive to form the substrate material;
    placing the substrate material into a furnace to perform a sintering process in order to form a plurality of holes in the substrate material; and
    permeating a heat conductive liquid into the holes,
    wherein the sinter powder includes aluminum, copper or tungsten, the adhesive includes a solvent of calcium oxide-aluminum oxide-silicon dioxide ($CaO-Al_2O_3-SiO_2$), a solvent of magnesium-aluminum oxide-silicon dioxide ($Mg-Al_2O_3-SiO_2$) or a solvent of manganese monoxide-magnesium oxide-aluminum oxide-silicon dioxide ($MnO-MgO-Al_2O_3-SiO_2$).

2. The manufacturing method of the heat dissipation substrate of claim 1, wherein the heat conductive liquid is a thermal conductive grease.

3. The manufacturing method of the heat dissipation substrate of claim 1, wherein the heat conductive liquid is further permeated into the holes by vacuum effect or capillarity.

4. The manufacturing method of the heat dissipation substrate of claim 1, wherein a coating is further disposed on a non-heat dissipation surface of the substrate material.

5. The manufacturing method of the heat dissipation substrate of claim 1, wherein an imperforate layer is further covered on a non-heat dissipation surface of the substrate material.

* * * * *